(12) United States Patent
Naito et al.

(10) Patent No.: US 9,178,471 B2
(45) Date of Patent: Nov. 3, 2015

(54) RESONATING ELEMENT, RESONATOR, OSCILLATOR, ELECTRONIC APPARATUS, AND MOBILE OBJECT

(71) Applicant: Seiko Epson Corporation, Tokyo (JP)

(72) Inventors: Matsutaro Naito, Minowa (JP); Toshiaki Sato, Minowa (JP); Jun Nishide, Ina (JP); Takumi Suzuki, Minowa (JP)

(73) Assignee: Seiko Epson Corporation (JP)

(\*) Notice: Subject to any disclaimer, the term of this patent is extended or adjusted under 35 U.S.C. 154(b) by 256 days.

(21) Appl. No.: 13/959,986

(22) Filed: Aug. 6, 2013

(65) Prior Publication Data

US 2015/0028959 A1 Jan. 29, 2015

(30) Foreign Application Priority Data

Jul. 25, 2013 (JP) ................................. 2013-154910

(51) Int. Cl.
| | |
|---|---|
| *H01L 41/08* | (2006.01) |
| *H03H 9/19* | (2006.01) |
| *H03B 5/32* | (2006.01) |
| *H03H 9/02* | (2006.01) |
| *H03H 9/17* | (2006.01) |
| *H03H 3/04* | (2006.01) |
| *H03H 9/05* | (2006.01) |
| *H03H 9/10* | (2006.01) |

(52) U.S. Cl.
CPC ............. *H03B 5/32* (2013.01); *H03H 9/02023* (2013.01); *H03H 9/177* (2013.01); *H03H 9/19* (2013.01); *H03H 9/0509* (2013.01); *H03H 9/0547* (2013.01); *H03H 9/1014* (2013.01); *H03H 2003/0457* (2013.01)

(58) Field of Classification Search
CPC . H03H 9/19; H03H 9/177; H03H 2003/0457; H03H 2003/0428; H01L 41/047
USPC .................................... 310/363–366; 331/158
See application file for complete search history.

(56) References Cited

U.S. PATENT DOCUMENTS

| | | | | |
|---|---|---|---|---|
| 4,370,584 | A * | 1/1983 | Ikeno et al. ................... | 310/365 |
| 5,078,834 | A * | 1/1992 | Witte .............................. | 216/18 |
| 6,191,524 | B1 * | 2/2001 | Sasaki et al. .................. | 310/367 |
| 2007/0126519 | A1 * | 6/2007 | Mizumura et al. ............ | 331/158 |
| 2009/0085428 | A1 | 4/2009 | Maeda | |
| 2013/0241359 | A1 * | 9/2013 | Naito et al. ................... | 310/348 |

FOREIGN PATENT DOCUMENTS

| | | |
|---|---|---|
| JP | 03-151705 B2 | 6/1991 |
| JP | 04-276915 B2 | 10/1992 |
| JP | 3235515 B2 | 12/2001 |
| JP | 2007208771 A * | 8/2007 |

(Continued)

*Primary Examiner* — J. San Martin
(74) *Attorney, Agent, or Firm* — Harness, Dickey & Pierce, P.L.C.

(57) ABSTRACT

A resonating element has a quartz crystal substrate having a vibrating portion and a thin-walled portion that is thinner than the vibrating portion, and a pair of excitation electrodes respectively disposed on opposite surfaces of the vibrating portion. Moreover, in the excitation electrode, each of a pair of sides arranged in a Z'-axis direction is convexly curved toward the center so that the excitation electrode has a constricted portion in which a length in the Z'-axis direction increases gradually from a central portion toward both ends in an X-axis direction.

15 Claims, 14 Drawing Sheets

(56) References Cited

FOREIGN PATENT DOCUMENTS

| | | | | |
|---|---|---|---|---|
| JP | 2008301111 | A | * | 12/2008 |
| JP | 2008306594 | A | * | 12/2008 |
| JP | 4665849 | B2 | | 4/2011 |
| JP | 5040654 | B2 | | 10/2012 |
| WO | WO-2007032444 | A1 | | 3/2007 |

* cited by examiner

RESONATING ELEMENT, RESONATOR, OSCILLATOR, ELECTRONIC APPARATUS, AND MOBILE OBJECT

TECHNICAL FIELD

The present invention relates to a resonating element, a resonator, an oscillator, an electronic apparatus, and a mobile object.

BACKGROUND

In AT-cut quartz crystal resonating elements, the vibration mode of a primary vibration to be excited is the thickness-shear vibration. The AT-cut quartz crystal resonating elements are suitable for downsizing and higher frequency and exhibit an excellent cubic curve in frequency-temperature characteristics, and therefore have been used in many areas such as piezoelectric oscillators and electronic apparatuses.

The AT-cut quartz crystal resonating element includes an AT-cut quartz crystal substrate and a pair of excitation electrodes provided on both surfaces of the AT-cut quartz crystal substrate. By applying an alternating voltage between the pair of excitation electrodes, the primary vibration (thickness-shear vibration) is excited. Here, in an AT-cut quartz crystal resonator of JP-A-4-276915, for suppressing a secondary vibration (spurious) other than the primary vibration, the shape of each of excitation electrodes is a "constricted" shape in which the width of a central portion in an X-axis direction is made narrower than the width of both ends. Although the spurious may be suppressed to some extent even with such a configuration, the effect is not sufficient.

The reason will be described below. In the AT-cut quartz crystal resonator of JP-A-4-276915, a flat plate-like AT-cut quartz crystal substrate with a constant thickness is used. In such an AT-cut quartz crystal substrate, a region interposed between a pair of excitation electrodes is a vibration region, and within the vibration region, a vibration region of the primary vibration and a vibration region of the secondary vibration are generated. In other words, even when the occurrence of the spurious is attempted to be suppressed through the contrivance of the shape of the excitation electrode as in JP-A-4-276915, the vibration region of the secondary vibration is inevitably generated in the vibration region, which causes the excitation of the secondary vibration.

SUMMARY

A resonating element capable of suppressing a secondary vibration, a resonator, an oscillator, an electronic apparatus, and a mobile object are to be provided.

The invention has been made to solve at least a part of the problems described above, and the invention can be realized as the following modes or application examples.

A resonating element of the invention includes: a quartz crystal substrate having a vibrating portion and a thin-walled portion, the vibrating portion including a vibration region vibrating in the thickness-shear vibration, the thin-walled portion being integrated with the vibrating portion and having a thickness smaller than that of the vibrating portion; and a pair of excitation electrodes respectively disposed on both surfaces of the vibrating portion, wherein when directions orthogonal to each other in plan view of the quartz crystal substrate are defined as a first direction and a second direction, at least one of the pair of excitation electrodes has a constricted portion formed by having, in each of a pair of outlines arranged in the first direction, a portion that is convexly curved toward a center line of the excitation electrode along the second direction.

With this configuration, it is possible to provide a resonating element capable of suppressing a secondary vibration.

In the resonating element of the invention, it is preferable that when axes obtained by rotating, about an X-axis as an electrical axis of quartz crystal, a Z-axis as an optic axis and a Y-axis as a mechanical axis by a predetermined angle are defined as a Z'-axis and a Y'-axis, the quartz crystal substrate has a thickness in a direction along the Y'-axis.

With this configuration, the resonating element is excellent in temperature characteristics.

In the resonating element of the invention, it is preferable that the constricted portion is disposed in an entire region in the second direction.

With this configuration, a secondary vibration can be suppressed more effectively.

In the resonating element of the invention, it is preferable that the first direction is the Z'-axis direction, and that the second direction is the X-axis direction.

With this configuration, a secondary vibration in the Z'-axis direction can be suppressed.

In the resonating element of the invention, it is preferable that the pair of outlines are each curved in an arc-shape.

With this configuration, the secondary vibration in the Z'-axis direction can be effectively suppressed.

In the resonating element of the invention, it is preferable that when a diameter of a circle having the arc as a portion of the circumference is $\varphi$, a length of the vibrating portion in the X-axis direction is Mx, a length thereof in the Z'-axis direction is Mz, and an order of a vibration mode in the Z'-axis direction is N (where N is a natural number of 2 or more), the relation of the following expression (1) is satisfied.

Mathematical Expression 1 (1)

$$\left(\frac{Mx}{Mz/(N+3)}\right) \times 0.8 \leq \varphi \leq \left(\frac{Mx}{Mz/(N+3)}\right) \times 1.2$$

With this configuration, the secondary vibration in the Z'-axis direction can be suppressed more effectively.

In the resonating element of the invention, it is preferable that a region involved in the vibration mode in N=2 in the Z'-axis direction has a first region that is located at the constricted portion and a second region and a third region that are present outside the excitation electrode and arranged along the Z'-axis with the first region interposed therebetween.

With this configuration, the secondary vibration in the Z'-axis direction can be effectively suppressed.

In the resonating element of the invention, it is preferable that the first direction is the X-axis direction, and that the second direction is the Z'-axis direction.

With this configuration, a secondary vibration in the X-axis direction can be suppressed.

In the resonating element of the invention, it is preferable that the pair of outlines are each curved in an arc-shape.

With this configuration, the secondary vibration in the X-axis direction can be effectively suppressed.

In the resonating element of the invention, it is preferable that when a diameter of a circle having the arc as a portion of the circumference is $\varphi$, a length of the vibrating portion in the X-axis direction is Mx, a length thereof in the Z'-axis direction is Mz, and an order of a vibration mode in the X-axis direction is N (where N is a natural number of 3 or more), the relation of the following expression (2) is satisfied.

Mathematical Expression 2 (2)

$$\left(\frac{Mz}{Mx/(N+2)}\right) \times 0.8 \leq \varphi \leq \left(\frac{Mz}{Mx/(N+2)}\right) \times 1.2$$

With this configuration, the secondary vibration in the X-axis direction can be suppressed more effectively.

In the resonating element of the invention, it is preferable that a region involved in the vibration mode in N=3 in the X-axis direction has a first region that is located at the constricted portion and a second region and a third region that are present outside the excitation electrode and arranged along the X-axis with the first region interposed therebetween.

With this configuration, the secondary vibration in the X-axis direction can be suppressed more effectively.

A resonator of the invention includes: the resonating element of the invention; and a package accommodating the resonating element.

With this configuration, a resonator with high reliability is obtained.

An oscillator of the invention includes: the resonating element of the invention; and an oscillator circuit driving the resonating element.

With this configuration, an oscillator with high reliability is obtained.

An electronic apparatus of the invention includes the resonating element of the invention.

With this configuration, an electronic apparatus with high reliability is obtained.

A mobile object of the invention includes the resonating element of the invention.

With this configuration, a mobile object with high reliability is obtained.

BEST MODE FOR CARRYING OUT THE INVENTION

Figure 1A:
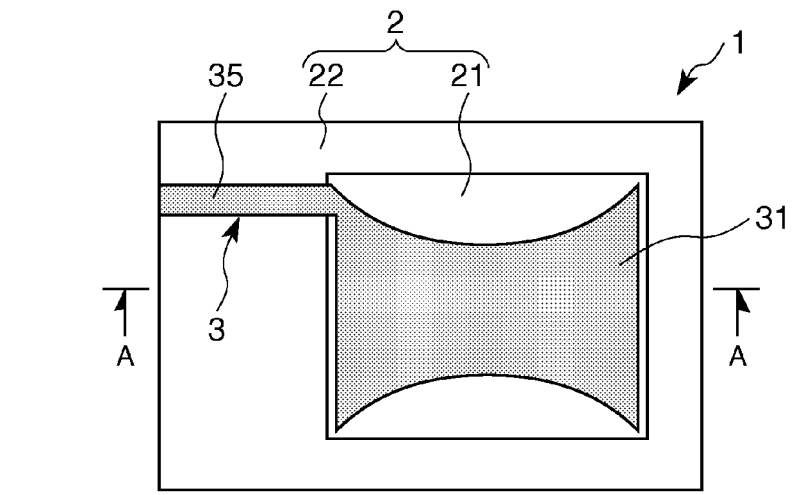
FIG. 1(a) is a plan view of a resonating element according to a first embodiment of the invention.

Hereinafter, a resonating element, a resonator, an oscillator, an electronic apparatus, and a mobile object of the invention will be described in detail based on preferred embodiments shown in the drawings.

1. Resonating Element

First, the resonating element of the invention will be described.

First Embodiment

Figure 1B:
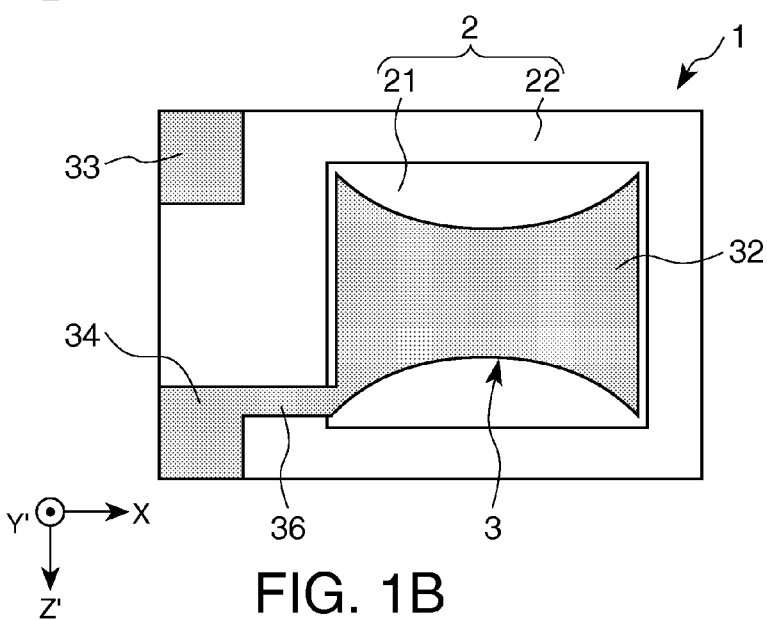
FIG. 1(b) is a see-through view.
Figure 1C:
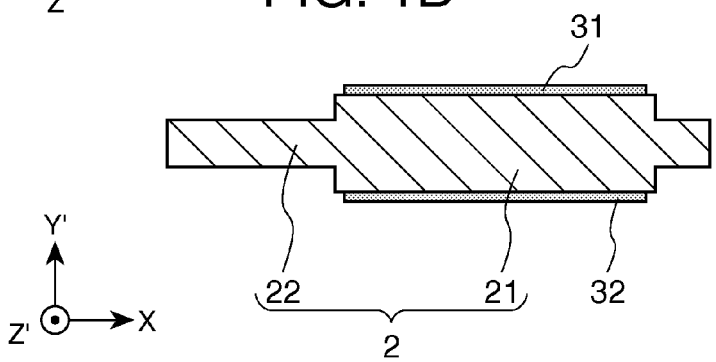
FIG. 1(c) is a cross-sectional view taken along line A-A in FIG. 1(a).
Figure 2:
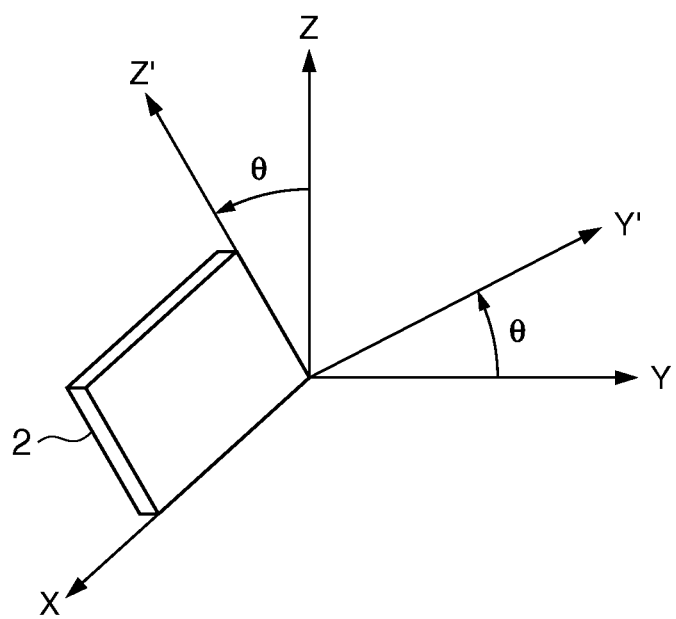
FIG. 2 is a diagram for explaining a relation between an AT-cut quartz crystal substrate and crystal axes of quartz crystal.
Figure 3A:
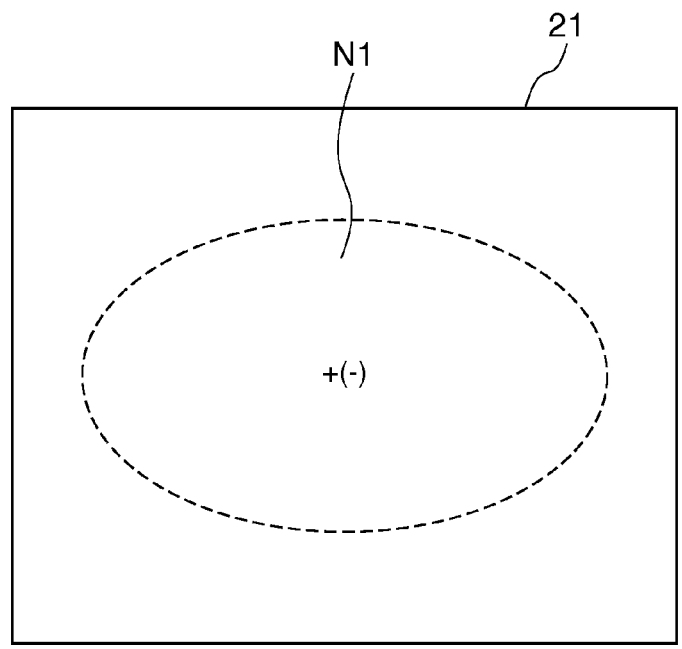
FIG. 3(a) is a plan view showing a region involved in a primary vibration mode.
Figure 3B:
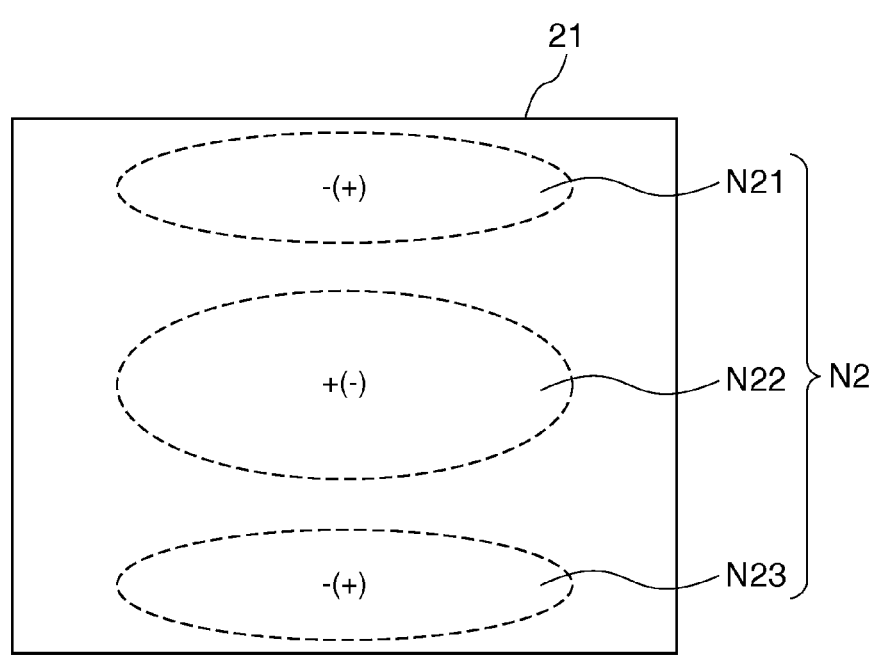
FIG. 3(b) is a plan view showing a region involved in a secondary vibration mode in a Z'-axis direction.
Figure 4:
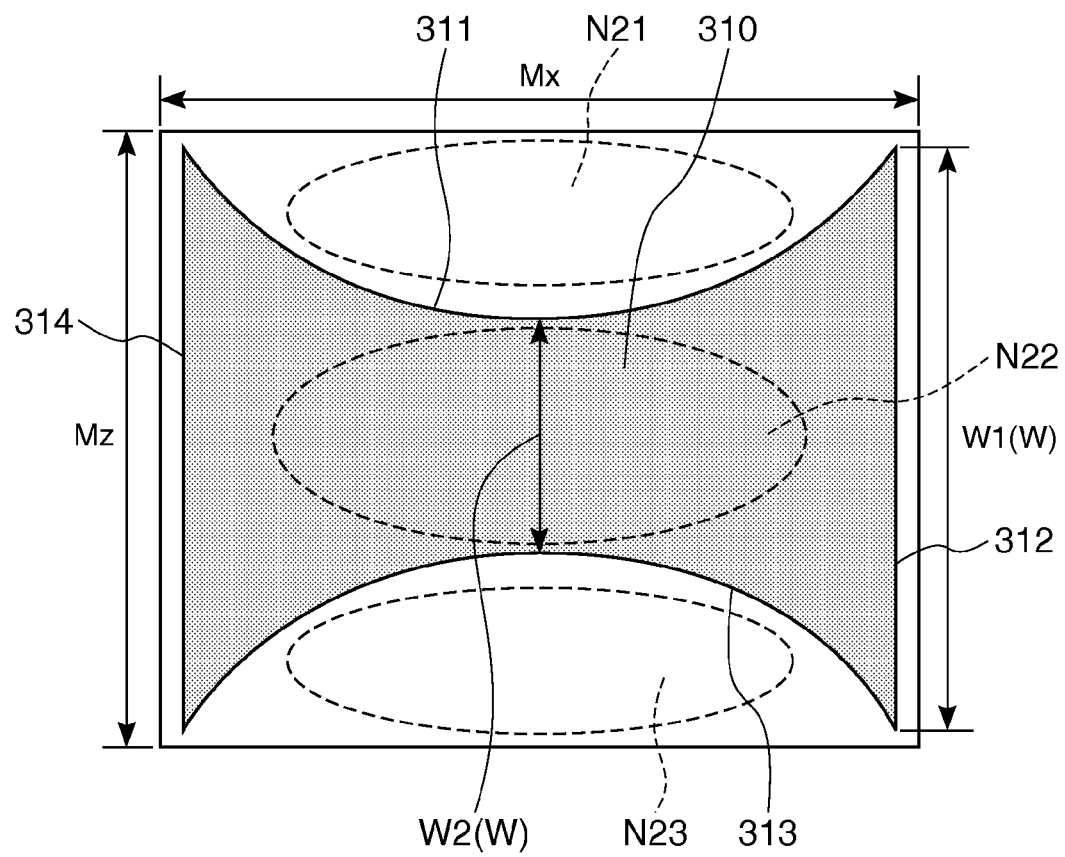
FIG. 4 is a plan view of an excitation electrode of the resonating element shown in FIG. 1.
Figure 4:
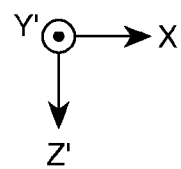
Figure 5:
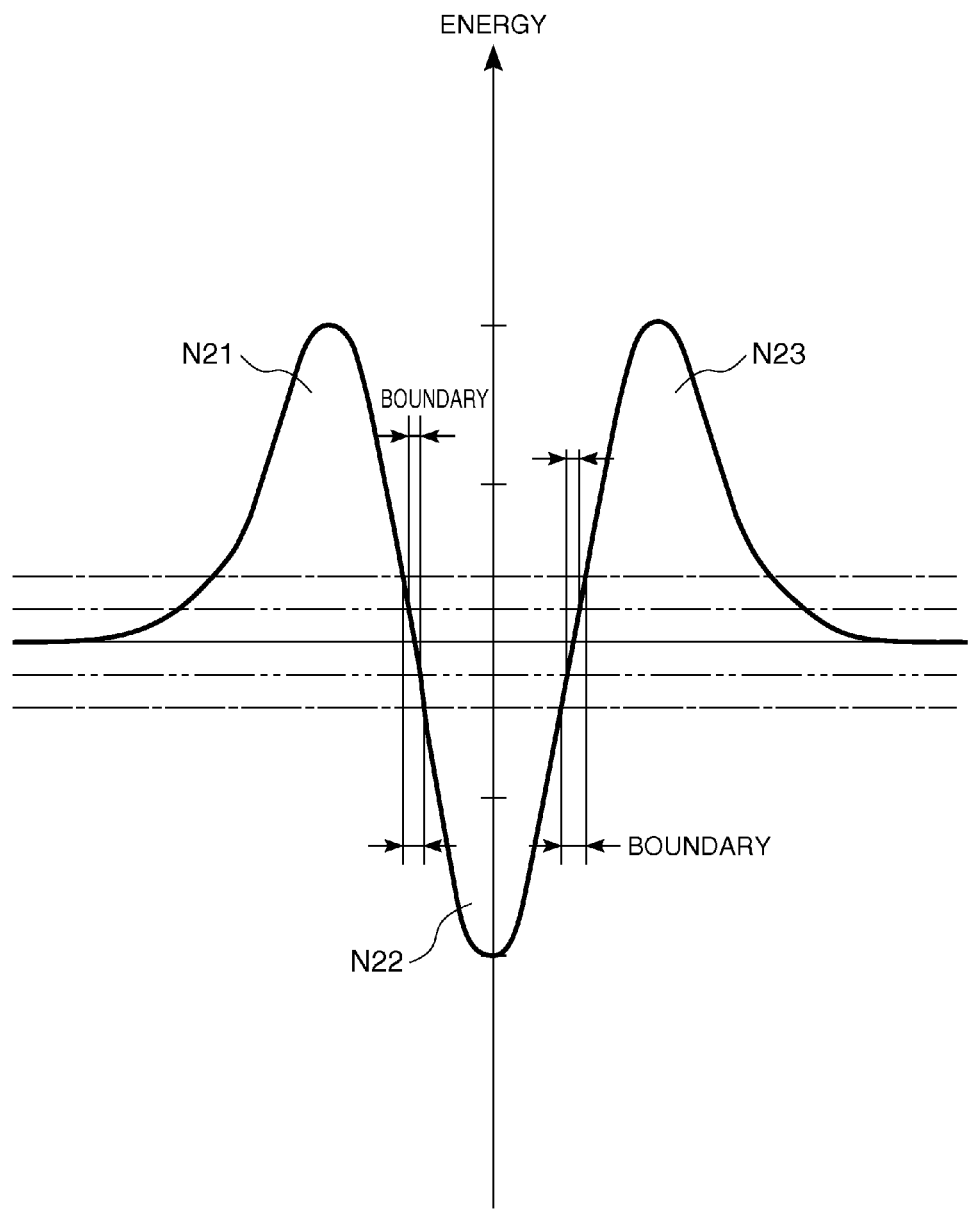
FIG. 5 is a graph showing vibration energy in the secondary vibration mode in the Z'-axis direction.

FIG. 1(a) is a plan view of a resonating element according to a first embodiment of the invention; FIG. 1(b) is a see-through view; and FIG. 1(c) is a cross-sectional view taken along line A-A in FIG. 1(a). FIG. 2 is a diagram for explaining a relation between an AT-cut quartz crystal substrate and crystal axes of quartz crystal. FIG. 3(a) is a plan view showing a region involved in a primary vibration mode; and FIG. 3(b) is a plan view showing a region involved in a secondary vibration mode in a Z'-axis direction. FIG. 4 is a plan view of an excitation electrode of the resonating element shown in FIG. 1. FIG. 5 is a graph showing vibration energy in the secondary vibration mode in the Z'-axis direction.

As shown in FIGS. 1(a) to 1(c), the resonating element 1 has a quartz crystal substrate 2 and an electrode 3 formed on the quartz crystal substrate 2.

Quartz Crystal Substrate

Quartz crystal as the material of the quartz crystal substrate 2 belongs to the trigonal system, and has crystal axes X, Y, and Z orthogonal to each other as shown in FIG. 2. The X-axis, the Y-axis, and the Z-axis are referred to as an electrical axis, a mechanical axis, and an optic axis, respectively. The quartz crystal substrate 2 of the embodiment is a "rotated Y-cut quartz crystal substrate" that is cut out along a plane obtained by rotating an XZ-plane about the X-axis by a predetermined angle θ. For example, a substrate that is cut out along a plane obtained by rotating by θ=35° 15' is referred to as "AT-cut quartz crystal substrate". The use of such a quartz crystal substrate makes the resonating element 1 excellent in temperature characteristics. However, the quartz crystal substrate 2 is not limited to the AT-cut quartz crystal substrate as long as the thickness-shear vibration can be excited. For example, a BT-cut quartz crystal substrate may be used. In the following, the Y-axis and the Z-axis that are rotated about the X-axis corresponding to the angle θ are defined as a Y'-axis and a Z'-axis.

The quartz crystal substrate 2 has a thickness in the Y'-axis direction, and extends in an XZ'-plane direction. Moreover, the quartz crystal substrate 2 has, in plan view, an oblong shape with long sides (length) in a direction along the X-axis and short sides (width) in a direction along the Z'-axis. The quartz crystal substrate 2 has a tip end on the negative X-axis side and a base end on the positive X-axis side, and is fixed to an object at the base end portion. However, the quartz crystal substrate 2 may have an oblong shape with long sides (length) in the direction along the Z'-axis and short sides (width) in the direction along the X-axis.

Moreover, the quartz crystal substrate 2 is of a so-called "mesa-type", and has a thick-walled vibrating portion 21 and a thin-walled portion 22 provided around the vibrating portion 21 and having a thickness smaller than that of the vibrating portion 21. Moreover, both surfaces of the vibrating portion 21 protrude from both surfaces of the thin-walled portion 22. According to the "mesa-type" quartz crystal substrate 2, vibrations are concentrated on the vibrating portion 21 having a large mass, so that vibrations can be confined within the vibrating portion 21. Moreover, a region N1 involved in a primary vibration mode F and a region N2 involved in a secondary vibration mode Fz, which are generated within the vibrating portion 21 and will be described later, can be determined dominantly by the shape and size of the vibrating portion 21, making it possible to provide a configuration that is almost not affected by the shape or arrangement of excitation electrodes 31 and 32.

A bevel process or a convex process may be applied to the quartz crystal substrate 2. With this configuration, improvement in vibration characteristics can be achieved.

Electrode

The electrode 3 has the excitation electrodes 31 and 32, pad electrodes 33 and 34, and lead electrodes 35 and 36. The excitation electrode 31 is provided on a front surface (main surface on the positive Y' side) of the vibrating portion 21, while the excitation electrode 32 is provided on a rear surface (main surface on the negative Y' side) of the vibrating portion 21 so as to face the excitation electrode 31. The shapes of the excitation electrodes 31 and 32 are substantially the same as each other, and edges of the excitation electrodes 31 and 32 in plan view almost coincide with each other. The pad electrodes 33 and 34 are provided to be arranged in the Z'-axis direction at a base end portion of the thin-walled portion 22 on a rear surface thereof. The lead electrode 35 passes over the front surface and side surface of the thin-walled portion 22 to electrically connect the excitation electrode 31 with the pad electrode 33. The lead electrode 36 passes over the rear surface of the thin-walled portion 22 to electrically connect the excitation electrode 32 with the pad electrode 34. Then, by applying an alternating voltage between the excitation electrodes 31 and 32 via the pad electrodes 33 and 34, the thickness-shear vibration is excited in the vibrating portion 21.

Although the configuration of the electrode 3 (the excitation electrodes 31 and 32, the pad electrodes 33 and 34, and the lead electrodes 35 and 36) is not particularly limited, the electrode can be composed of a metal coated film in which, for example, Au (gold) or Al (aluminum), or an alloy containing as a main component Au (gold) or Al (aluminum) is stacked on an under layer such as of Cr (chromium) or Ni (nickel).

The configuration of the resonating element 1 has been briefly described above. Next, the shapes of the excitation electrodes 31 and 32 as a feature of the resonating element 1 will be described in detail. Before that, the primary vibration mode F and the secondary vibration mode Fz that occur in an AT-cut resonator will be described.

First, FIG. 3(a) shows the region N1 involved in the primary vibration mode F of the quartz crystal substrate 2. As understood from the same drawing, the region N1 exists at one place of a central portion of the vibrating portion 21. Next, FIG. 3(b) shows the region N2 involved in the secondary vibration mode (second vibration mode) Fz in the Z'-axis direction of the quartz crystal substrate 2. As understood from the same drawing, the region N2 is divided along the Z'-axis direction into three regions, a region (second region) N21, a region (first region) N22, and a region (third region) N23, and has a charge distribution in which when the region N22 at the center is positive, the regions N21 and N23 on both sides of the region N22 are both negative, while when the region N22 at the center is negative, the regions N21 and N23 on the both sides are both positive.

Here, in the mesa-type quartz crystal substrate 2 as described above, since vibrations are confined in the vibrating portion 21, regions (for example, the regions N1 and N2) involved in respective vibration modes are determined by the shape and size of the vibrating portion 21. That is, in the flat plate-like AT-cut quartz crystal resonating element described in the Background Art, since the region interposed between the excitation electrodes is a vibration region, the regions N1 and N2 are determined dominantly by the shape and size of the excitation electrodes, so that the region N1 and the region N2 change depending on the shape, size, and the like of the excitation electrodes; whereas, in the resonating element 1, since the regions N1 and N2 are determined dominantly by the shape and size of the vibrating portion 21, the regions N1 and N2 do not almost change even when the shape, size, and the like of the excitation electrodes 31 and 32 change.

In the resonating element 1, therefore, by noting that the regions N1 and N2 are determined dominantly by the shape and size of the vibrating portion 21, the secondary vibration mode Fz is suppressed through the contrivance of the shapes of the excitation electrodes 31 and 32.

Hereinafter, the shapes of the excitation electrodes 31 and 32 will be described. However, since the excitation electrodes 31 and 32 have substantially the same shape as each other, the excitation electrode 31 will be described below as a representative, and the description of the excitation electrode 32 is omitted.

As shown in FIG. 4, a width (length in the Z'-axis direction) W1 of the excitation electrode 31 at both ends in the X-axis direction is longer than a width (length in the Z'-axis direction) W2 at the central portion in the X-axis direction, so that the excitation electrode 31 has substantially an "hourglass" shape with a constricted portion 310.

Description will be made specifically. Among four sides 311, 312, 313, and 314 forming outlines of the excitation electrode 31, the sides 312 and 314 arranged in the X-axis direction are each composed of substantially a straight line that extends in the Z'-axis direction. On the other hand, the side 311 of the sides 311 and 313 arranged in the Z'-axis direction is composed of a curved line that is convexly curved toward a center line of the excitation electrode 31 along the X-axis direction, and the side 313 is composed of a curved line that is convexly curved toward the center line of the excitation electrode 31 along the X-axis direction. Then, the width W of the excitation electrode 31 continuously increases gradually from the central portion toward the both ends in the X-axis direction, which forms the constricted portion 310.

Moreover, the side 311 passes to extend between the regions N21 and N22 (a boundary portion) while avoiding the region N21. Similarly, the side 313 passes to extend between the regions N22 and N23 (a boundary portion) while avoiding the region N23. That is, it can be said that the region N2 has the region N22 located at the excitation electrode 31 (the constricted portion 310) and the regions N21 and N23 present outside the excitation electrode 31 and arranged along the Z'-axis with the region N22 interposed therebetween. The "boundary portion" is preferably defined, as shown in FIG. 5, as a region of 20% or less of a maximum value (absolute value) of the vibration energy in the secondary vibration mode Fz, and more preferably defined as a region of 10% or less thereof.

By forming the excitation electrodes 31 and 32 into such a shape, the action of an electric field on the regions N21 and N23 involved in the secondary vibration mode Fz can be reduced, so that the occurrence of the secondary vibration mode Fz can be reduced. Moreover, since reductions in the areas of the excitation electrodes 31 and 32 can be minimized, the CI value of the primary vibration mode F can be maintained low.

Especially by disposing the constricted portion 310 in the entire region in the X-axis direction as in the embodiment, the side 311 is easily extended between the regions N21 and N22 (the boundary portion), and similarly, the side 313 is easily extended between the regions N22 and N23 (the boundary portion). Therefore, the above advantageous effects can be provided more remarkably.

Moreover, in the embodiment, the sides 311 and 313 are each composed of an arc. A diameter (diameter of a circle having the arc as a portion of the circumference) $\Phi$ of the sides 311 and 313 is not particularly limited. However, when a length of the vibrating portion 21 in the X-axis direction is Mx, a length thereof in the Z'-axis direction is Mz, and an order of the secondary vibration mode Fz is N (where N is a natural number of 2 or more), it is preferable to satisfy the relation of the following expression (3), and it is more preferable to satisfy the relation of the following expression (4). Since the order of the secondary vibration mode Fz is 2, N=2 in the embodiment. However, it is not limited to N=2, and the embodiment can be applied also to a secondary vibration mode in which N is a natural number of 3 or more.

Mathematical Expression 3 (3)
$$\left(\frac{Mx}{Mz/(N+3)}\right) \times 0.8 \leq \varphi \leq \left(\frac{Mx}{Mz/(N+3)}\right) \times 1.2$$

Mathematical Expression 4 (4)
$$\left(\frac{Mx}{Mz/(N+3)}\right) \times 0.9 \leq \varphi \leq \left(\frac{Mx}{Mz/(N+3)}\right) \times 1.1$$

By satisfying the relations described above, the side 311 can be extended between the regions N21 and N22 (the boundary portion), and similarly, the side 313 can be extended between the regions N22 and N23 (the boundary portion), more reliably as described above. Therefore, the above advantageous effects can be provided more reliably.

Sample 1 where $\varphi=[Mx/\{Mz/(N+3)\}] \times 1.2$, Sample 2 where $\varphi=[Mx/\{Mz/(N+3)\}] \times 0.8$, Sample 3 where $\varphi=[Mx/\{Mz/(N+3)\}] \times 0.4$, and Sample 4 where $\varphi=\infty$ (that is, each of the sides 311 and 313 is a straight line that extends in the X-axis direction) were prepared, and relations between the width W of the excitation electrodes 31 and 32 and the CI values of the primary vibration mode F and the secondary vibration mode Fz were measured. Since Mx=Mz=1 mm in the resonating elements used in the measurement, $\varphi=6$ mm in Sample 1, $\varphi=4$ mm in Sample 2, and $\varphi=6$ mm in Sample 3.

Figure 6:
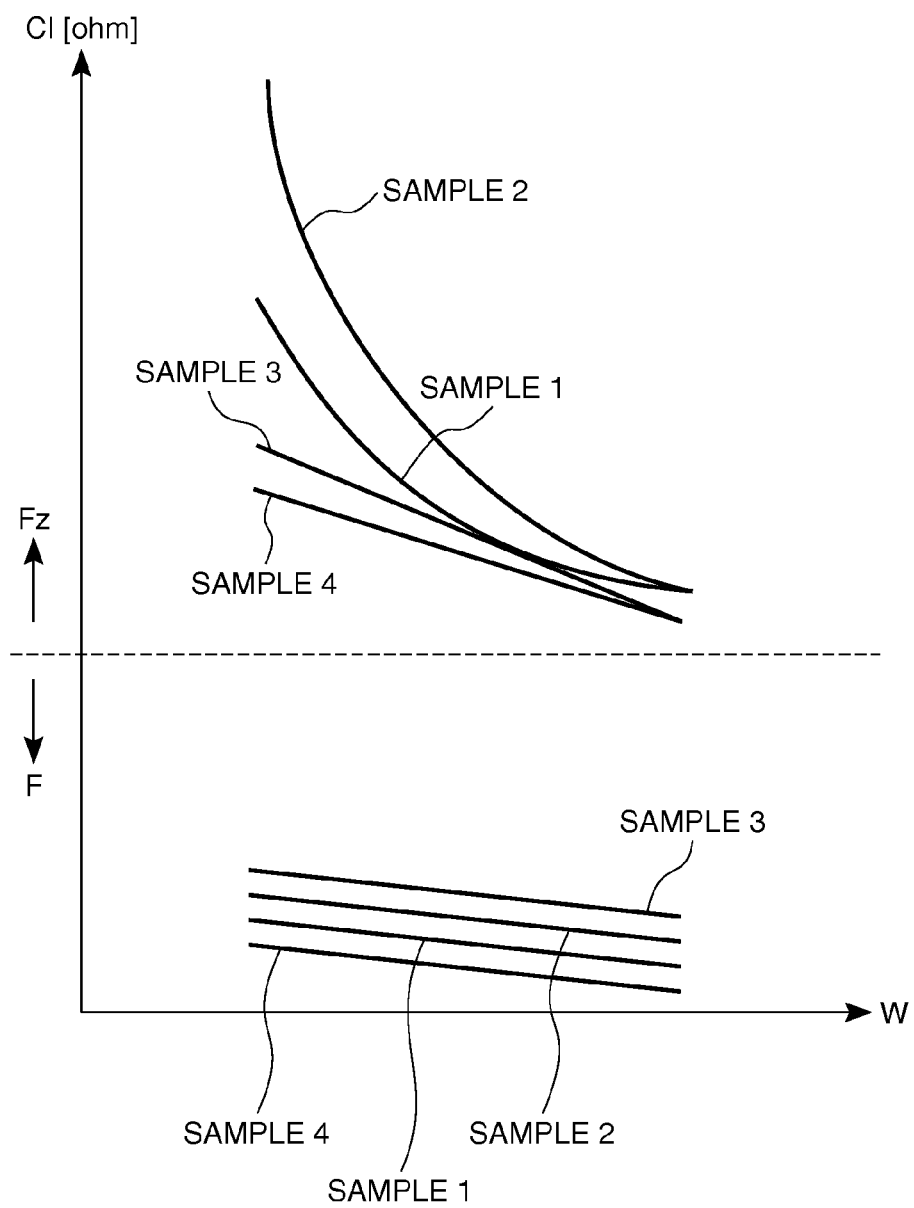
FIG. 6 is a graph showing a relation between the width of the excitation electrode and the CI values in the primary vibration mode and the secondary vibration mode.

FIG. 6 shows the results of the measurement. As understood from the same drawing, Samples 1 to 3 included in the resonating element of the invention are higher in the CI value of the secondary vibration mode Fz than Sample 4 not included in the resonating element of the invention. Therefore, it is understood that the secondary vibration mode Fz is more difficult to oscillate in Samples 1 to 3 than in Sample 4. Especially in Samples 1 and 2 satisfying the expression (3), the CI value exponentially increases as the width W is narrowed. Therefore, it is understood that the secondary vibration mode Fz is more difficult to oscillate by satisfying the expression (3).

In the embodiment, the sides 311 and 313 are both composed of an arc-shaped curved line. However, the shape of the sides 311 and 313 is not limited to this as long as the shape has a curved portion. For example, the sides 311 and 313 may be composed of a curved line having a portion of a different curvature radius such as a curved line whose curvature radius gradually increases from the central portion toward the both ends of the sides 311 and 313 or a curved line whose curvature radius gradually decreases from the central portion toward the both ends of the sides 311 and 313. Alternatively, a straight line may be included in the middle of each of the sides 311 and 313.

Moreover, in the embodiment, the side 311 passes to extend between the regions N21 and N22, while the side 313 passes to extend between the regions N23 and N22. However, it is not limited to this. For example, the side 311 may pass over the region N21, while the side 313 may pass over the region N23, or the sides 311 and 313 may pass over the region N22.

Moreover, in the embodiment, in the embodiment, the excitation electrodes 31 and 32 both have the hourglass shape described above. However, as long as at least one of the excitation electrodes 31 and 32 has a constricted portion, the other may not have a constricted portion. That is, the other may have, for example, a rectangular shape. Even with such a configuration, although somewhat inferior to the embodiment, the above advantageous effects can be provided.

Second Embodiment

Next, a second embodiment of a resonating element of the invention will be described.

Figure 7A:
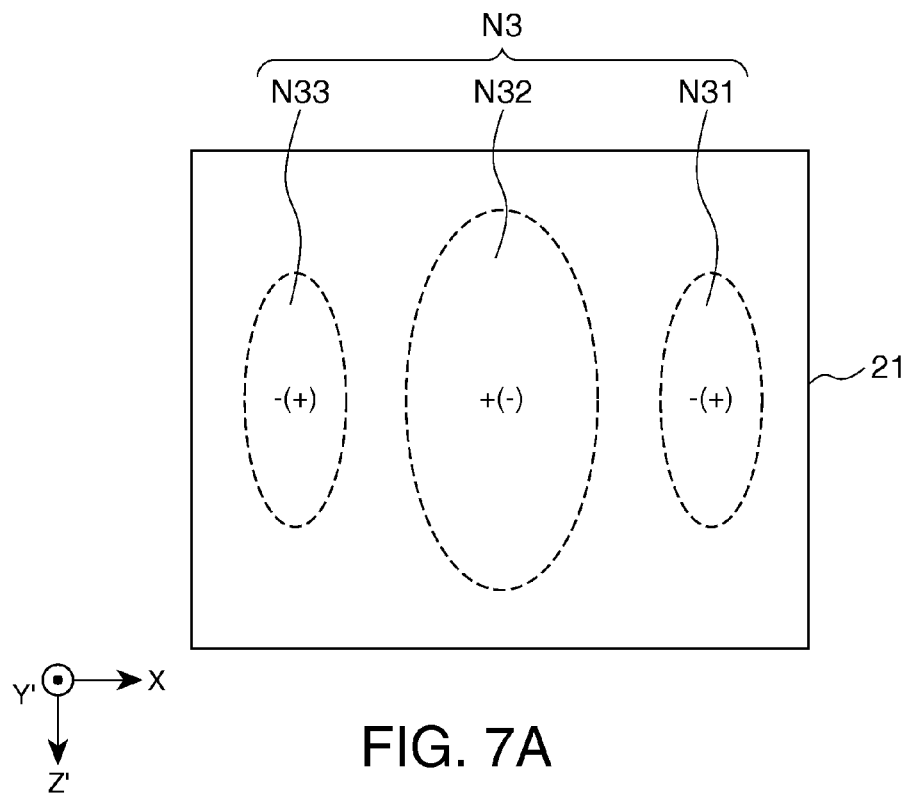
FIG. 7(a) is a plan view showing a region involved in a secondary vibration mode in an X-axis direction.
Figure 7B:
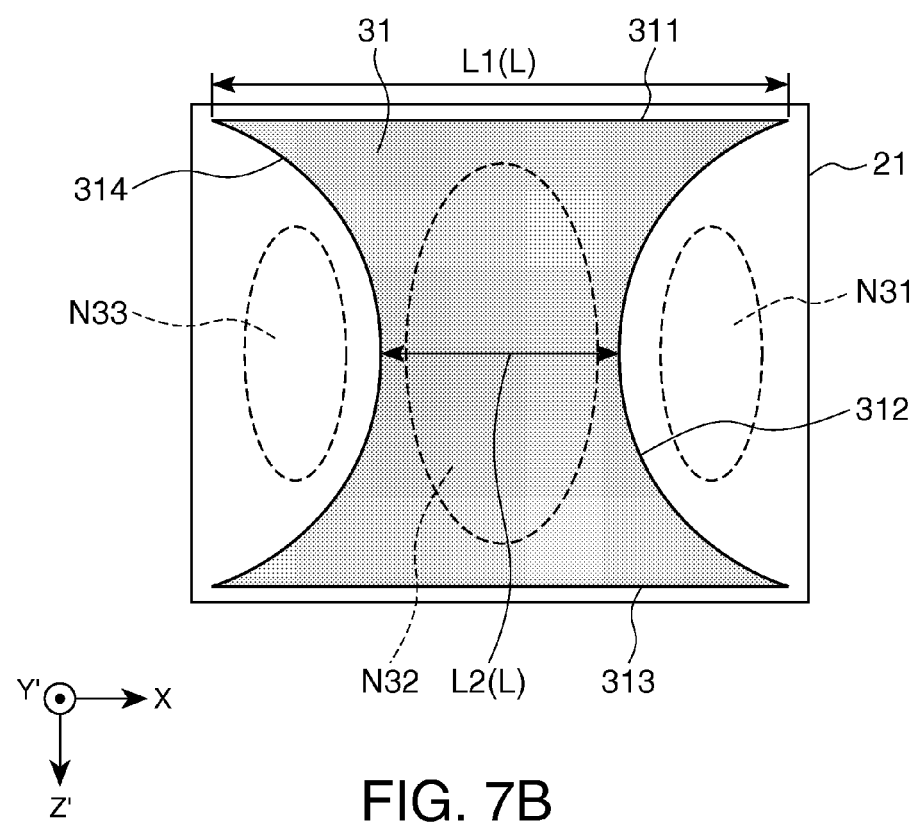
FIG. 7(b) is a plan view of an excitation electrode of a resonating element according to a second embodiment of the invention.
Figure 8:
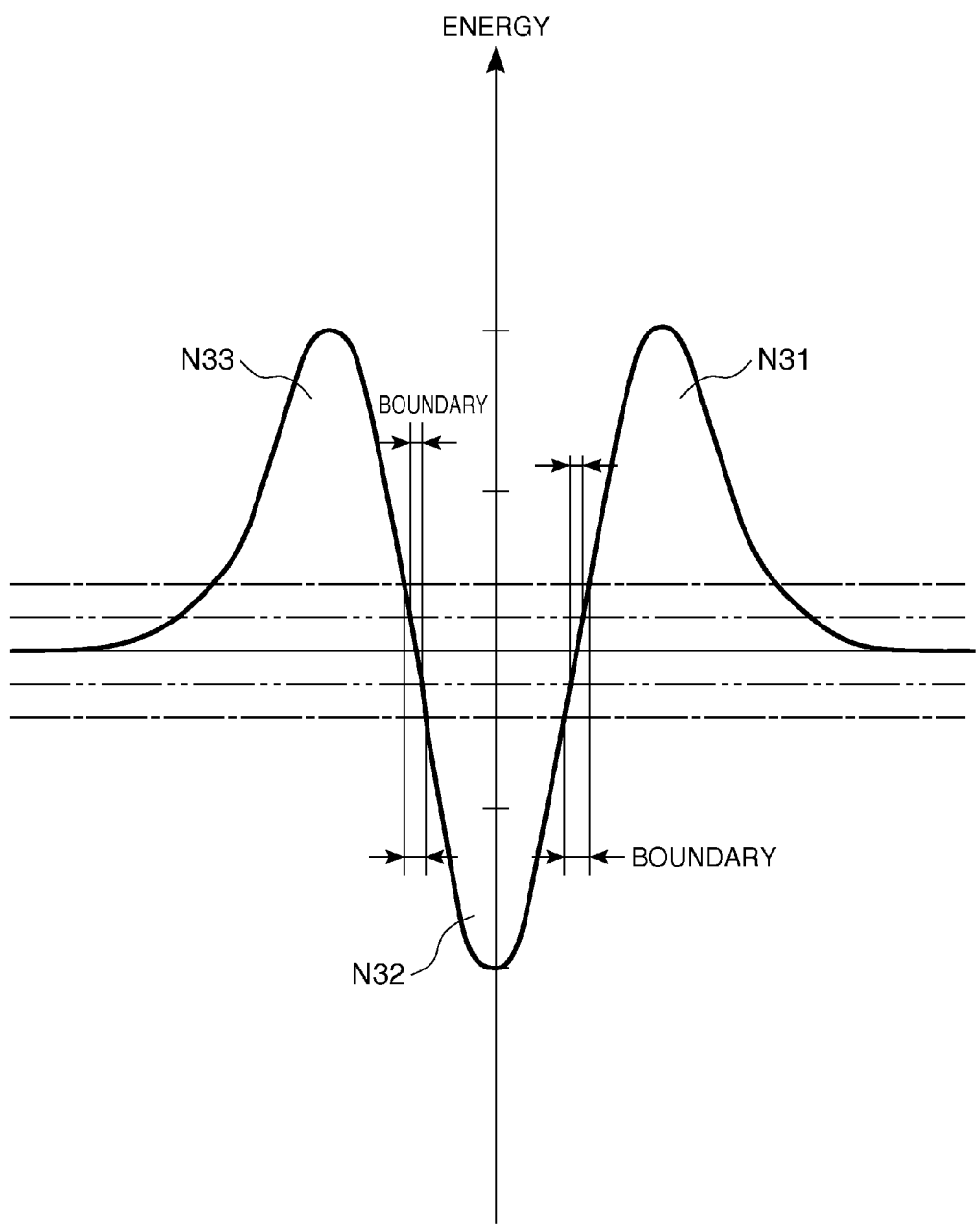
FIG. 8 is a graph showing vibration energy in the secondary vibration mode in the X-axis direction.

FIG. 7(a) is a plan view showing a region involved in a secondary vibration mode in the X-axis direction; and FIG. 7(b) is a plan view of an excitation electrode of the resonating element according to the second embodiment of the invention. FIG. 8 is a graph showing vibration energy in the secondary vibration mode in the X-axis direction.

Hereinafter, the resonating element of the second embodiment will be described mainly on differences from the first embodiment described above, and the description of similar matters is omitted.

The resonating element according to the second embodiment of the invention is similar to that of the first embodiment described above, excepting that the shape of the excitation electrode is different. Configurations similar to those of the first embodiment described above are denoted by the same reference numerals and signs.

In the resonating element 1 of the first embodiment described above, the shapes of the excitation electrodes 31 and 32 are contrived for suppressing the secondary vibration mode Fz in the Z'-axis direction. Based on the same idea, in the resonating element 1 of this embodiment, the shapes of the excitation electrodes 31 and 32 are contrived for suppressing a secondary vibration mode (third vibration mode) Fx in the X-axis direction. Similarly to the secondary vibration mode Fz in the Z'-axis direction, the secondary vibration mode Fx in the X-axis direction is also a vibration mode that is likely to occur. Therefore, by suppressing the secondary vibration mode Fx, improvements in the vibration characteristics of the resonating element 1 can be achieved similarly to the first embodiment described above.

FIG. 7(a) shows a region N3 involved in the secondary vibration mode Fx in the X-axis direction. As understood from the same drawing, the region N3 is divided along the X-axis direction into three regions, a region (second region) N31, a region (first region) N32, and a region (third region) N33, and has a charge distribution in which when the region N32 at the center is positive, the regions N31 and N33 on both sides of the region N32 are negative, while the region N32 at the center is negative, the regions N31 and N33 on the both sides are positive.

Here, in the mesa-type quartz crystal substrate 2 as described above, since vibrations are confined in the vibrating portion 21, regions (for example, N1 and N3) involved in respective vibration modes are determined by the shape and size of the vibrating portion 21. That is, in the resonating element 1, since the region N3 is determined dominantly by the shape and size of the vibrating portion 21, the region N3 does not almost change even when the shape, size, and the like of the excitation electrodes 31 and 32 change.

In the resonating element 1, therefore, noting that the region N3 is determined dominantly by the shape and size of the vibrating portion 21, the secondary vibration mode Fx is suppressed through the contrivance of the shapes of the excitation electrodes 31 and 32.

Hereinafter, the shapes of the excitation electrodes 31 and 32 will be described. However, since the excitation electrodes 31 and 32 have substantially the same shape as each other, the excitation electrode 31 will be described below as a representative, and the description of the excitation electrode 32 is omitted.

As shown in FIG. 7(b), a length (length in the X-axis direction) L1 of the excitation electrode 31 at both ends in the Z'-axis direction is longer than a length (length in the X-axis direction) L2 at a central portion thereof in the Z'-axis direction, so that the excitation electrode 31 has substantially an "hourglass" shape with the constricted portion 310. Description will be made specifically. Among the four sides 311, 312, 313, and 314 forming the outlines of the excitation electrode 31, the sides 311 and 313 arranged in the Z'-axis direction are each composed of substantially a straight line that extends in the X-axis direction. On the other hand, the side 312 of the sides 312 and 314 arranged in the X-axis direction is composed of a curved line that is convexly curved toward a center line of the excitation electrode 31 along the X-axis direction, and the side 314 is composed of a curved line that is convexly curved toward the center line of the excitation electrode 31 along the X-axis direction. Then, the length L of the excitation electrode 31 continuously increases gradually from the central portion toward the both ends in the Z'-axis direction, which forms the constricted portion 310.

Moreover, the side 312 passes to extend between the regions N31 and N32 (a boundary portion) while avoiding the region N31. Similarly, the side 314 passes to extend between the regions N32 and N33 (a boundary portion) while avoiding the region N33. That is, it can be said that the region N3 has the region N32 located at the excitation electrode 31 (the constricted portion 310) and the regions N31 and N33 present outside the excitation electrode 31 and arranged along the X-axis with the region N32 interposed therebetween. The "boundary portion" is preferably defined, as shown in FIG. 8, as a region of 20% or less of a maximum value (absolute value) of the vibration energy in the secondary vibration mode Fx, and more preferably defined as a region of 10% or less thereof.

By forming the excitation electrodes 31 and 32 into such a shape, the action of an electric field on the regions N31 and N33 involved in the secondary vibration mode Fx can be reduced, so that the occurrence of the secondary vibration mode Fx can be reduced. Moreover, since reductions in the areas of the excitation electrodes 31 and 32 can be minimized, the CI value of the primary vibration mode F can be maintained low.

Especially by disposing the constricted portion 310 in the entire region in the Z'-axis direction as in the embodiment, the side 312 is easily extended between the regions N31 and N32 (the boundary portion), and similarly, the side 314 is easily extended between the regions N32 and N33 (the boundary portion). Therefore, the above advantageous effects can be provided more remarkably.

Moreover, in the embodiment, the sides 312 and 314 are each composed of an arc. A diameter (diameter of a circle having the arc as a portion of the circumference) φ of the sides 312 and 314 is not particularly limited. However, when a length of the vibrating portion 21 in the X-axis direction is Mx, a length thereof in the Z'-axis direction is Mz, and an order of the secondary vibration mode Fx is N (where N is a natural number of 3 or more), it is preferable to satisfy the relation of the following expression (5), and it is more preferable to satisfy the relation of the following expression (6). Since the order of the secondary vibration mode Fx is 3, N=3 in the embodiment. However, it is not limited to N=3, and the embodiment can be applied also to a secondary vibration mode in which N is a natural number of 4 or more.

Mathematical Expression 5

$$\left(\frac{Mz}{Mx/(N+2)}\right) \times 0.8 \leq \varphi \leq \left(\frac{Mz}{Mx/(N+2)}\right) \times 1.2 \quad (5)$$

Mathematical Expression 6

$$\left(\frac{Mz}{Mx/(N+2)}\right) \times 0.9 \leq \varphi \leq \left(\frac{Mz}{Mx/(N+2)}\right) \times 1.1 \quad (6)$$

By satisfying the relations described above, the side 312 can be extended between the regions N31 and N32 (the boundary portion), and similarly, the side 314 can be extended between the regions N32 and N33 (the boundary portion), more reliably as described above. Therefore, the above advantageous effects can be provided more reliably.

In the embodiment, the sides 312 and 314 are both composed of an arc-shaped curved line. However, the shape of the sides 312 and 314 is not limited to this as long as the shape has a curved portion. For example, the sides 312 and 314 may be composed of a curved line having a portion of a different curvature radius such as a curved line whose curvature radius gradually increases from the central portion toward the both ends of the sides 312 and 314 or a curved line whose curvature radius gradually decreases from the central portion toward the both ends of the sides 312 and 314. Alternatively, a straight line may be included in the middle of each of the sides 312 and 314.

In the embodiment, the side 312 passes to extend between the regions N31 and N32, while the side 314 passes to extend between the regions N33 and N32. However, it is not limited to this. For example, the side 312 may pass over the region N31, while the side 314 may pass over the region N33, or the sides 312 and 314 may pass over the region N32.

Moreover, in the embodiment, in the embodiment, the excitation electrodes 31 and 32 both have the hourglass shape described above. However, as long as at least one of the excitation electrodes 31 and 32 has a constricted portion, the other may not have a constricted portion. That is, the other may have, for example, a rectangular shape. Even with such a configuration, although somewhat inferior to the embodiment, the above advantageous effects can be provided.

Also with the second embodiment described above, advantageous effects similar to those of the first embodiment described above can be provided.

2. Resonator

Next, a resonator (resonator of the invention) to which the resonating element 1 described above is applied will be described.

Figure 9:
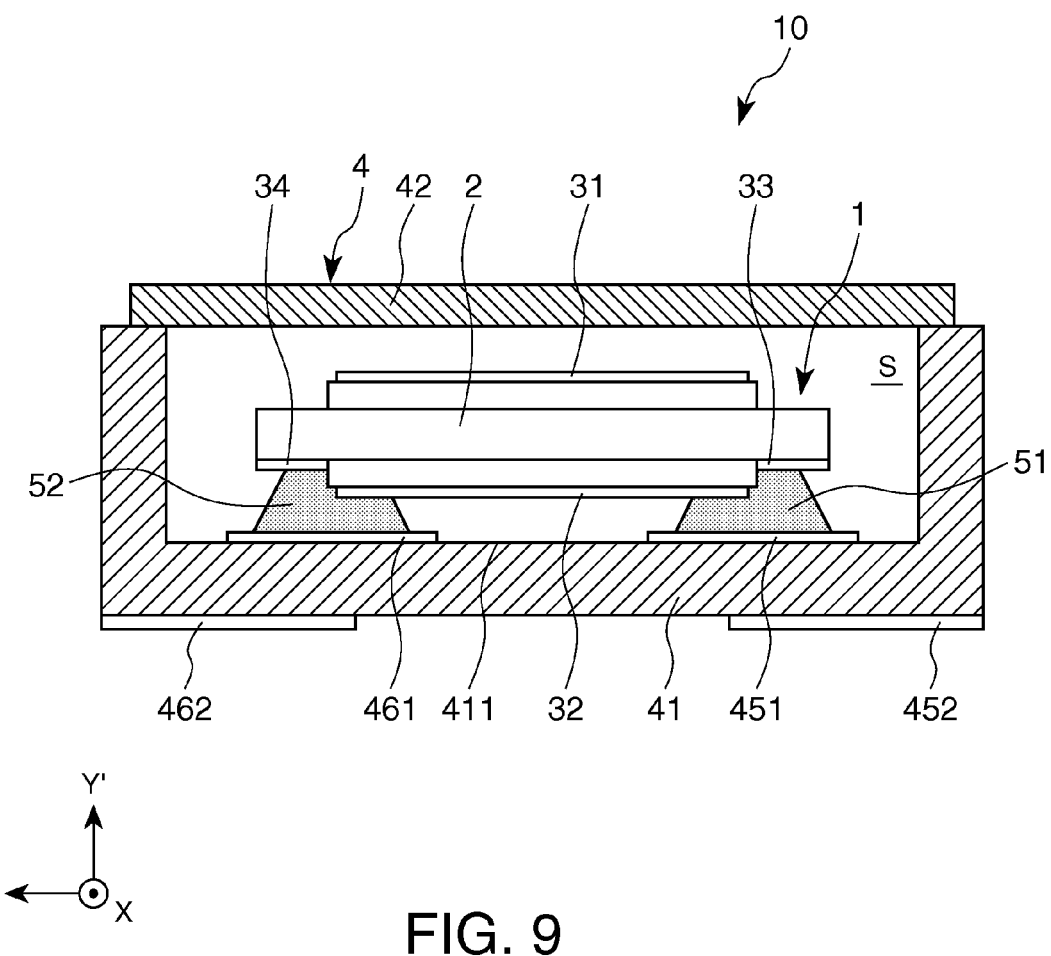
FIG. 9 is a cross-sectional view showing a preferred embodiment of a resonator of the invention.

FIG. 9 is a cross-sectional view showing a preferred embodiment of the resonator of the invention.

A resonator 10 shown in FIG. 9 has the resonating element 1 described above and a package 4 accommodating the resonating element 1.

Package

The package 4 has a box-like base 41 having a recess 411 that is opened in an upper surface, and a plate-like lid 42 bonded to the base 41 to close an opening of the recess 411. Then, the resonating element 1 is accommodated in an accommodating space S formed by closing the recess 411 with the lid 42. A reduced-pressure (vacuum) state may be established in the accommodating space S, or an inert gas such as nitrogen, helium, or argon may be sealed therein.

The constituent material of the base 41 is not particularly limited, but various types of ceramics such as of aluminum oxide can be used. Moreover, the constituent material of the lid 42 is not particularly limited, but it is desirable that the constituent material is a member having a coefficient of linear expansion close to that of the constituent material of the base 41. For example, when the ceramics described above are used as the constituent material of the base 41, an alloy such as Kovar is preferably used. The bonding between the base 41 and the lid 42 is not particularly limited. For example, the base 41 and the lid 42 may be bonded together via an adhesive, or may be bonded by seam welding or the like.

Connection electrodes 451 and 461 are formed on a bottom surface of the recess 411 of the base 41. Moreover, external mount terminals 452 and 462 are formed on a lower surface of the base 41. The connection electrode 451 is electrically connected to the external mount terminal 452 via a not-shown through-electrode formed in the base 41, while the connection electrode 461 is electrically connected to the external mount terminal 462 via a not-shown through-electrode formed in the base 41.

The configurations of the connection electrodes 451 and 461 and the external mount terminals 452 and 462 are not particularly limited as long as each of the electrodes has conductivity. For example, the electrodes can be composed of a metal coated film in which a coated film such as of Ni (nickel), Au (gold), Ag (silver), or Cu (copper) is stacked on a metallization layer (under layer) such as of Cr (chromium) or W (tungsten).

The resonating element 1 accommodated in the accommodating space S is fixed to the base 41 with conductive adhesives 51 and 52. The conductive adhesive 51 is disposed in contact with the connection electrode 451 and the pad electrode 33, while the conductive adhesive 52 is disposed in contact with the connection electrode 461 and the pad electrode 34. The conductive adhesives 51 and 52 are not particularly limited as long as the adhesives have conductivity and adhesive properties. For example, one obtained by dispersing conductive fillers into an adhesive such as silicone-based, epoxy-based, acrylic-based, polyimide-based, or bismaleimide-based can be used.

3. Oscillator

Next, an oscillator (oscillator of the invention) to which the resonator of the invention is applied will be described.

Figure 10:
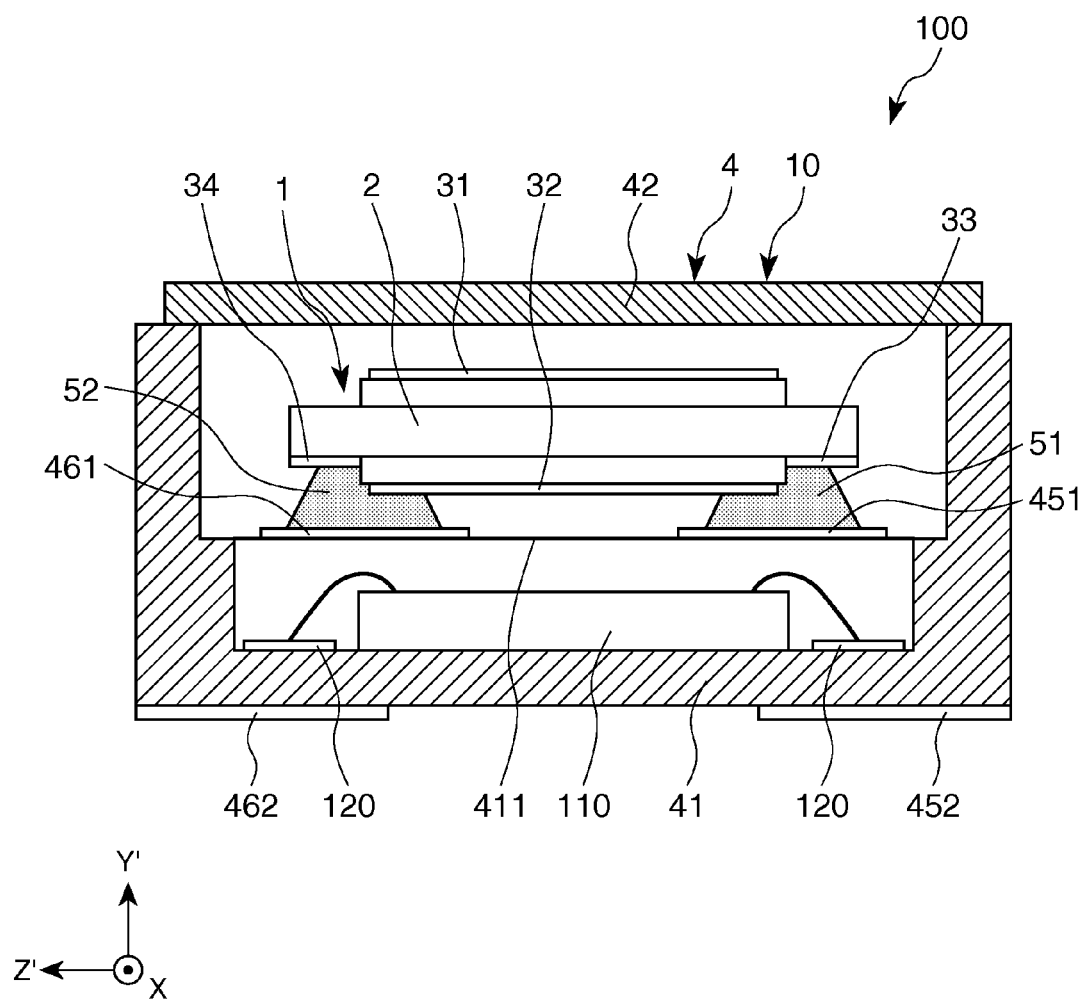
FIG. 10 is a cross-sectional view showing a preferred embodiment of an oscillator of the invention.

FIG. 10 is a cross-sectional view showing a preferred embodiment of the oscillator of the invention.

An oscillator 100 shown in FIG. 10 has the resonator 10 and an IC chip 110 for driving the resonating element 1. Hereinafter, the oscillator 100 will be described mainly on differences from the resonator described above, and the description of similar matters is omitted.

As shown in FIG. 10, the IC chip 110 is fixed in the recess 411 of the base 41 in the oscillator 100. The IC chip 110 is electrically connected to a plurality of internal terminals 120 formed on the bottom surface of the recess 411. Some of the plurality of internal terminals 120 are connected to the connection electrodes 451 and 461, while others are connected to the external mount terminals 452 and 462. The IC chip 110 has an oscillator circuit for controlling the driving of the resonating element 1. Then, when the resonating element 1 is driven by the IC chip 110, a signal at a predetermined frequency can be extracted.

4. Electronic Apparatus

Next, an electronic apparatus (electronic apparatus of the invention) to which the resonator of the invention is applied will be described.

Figure 11:
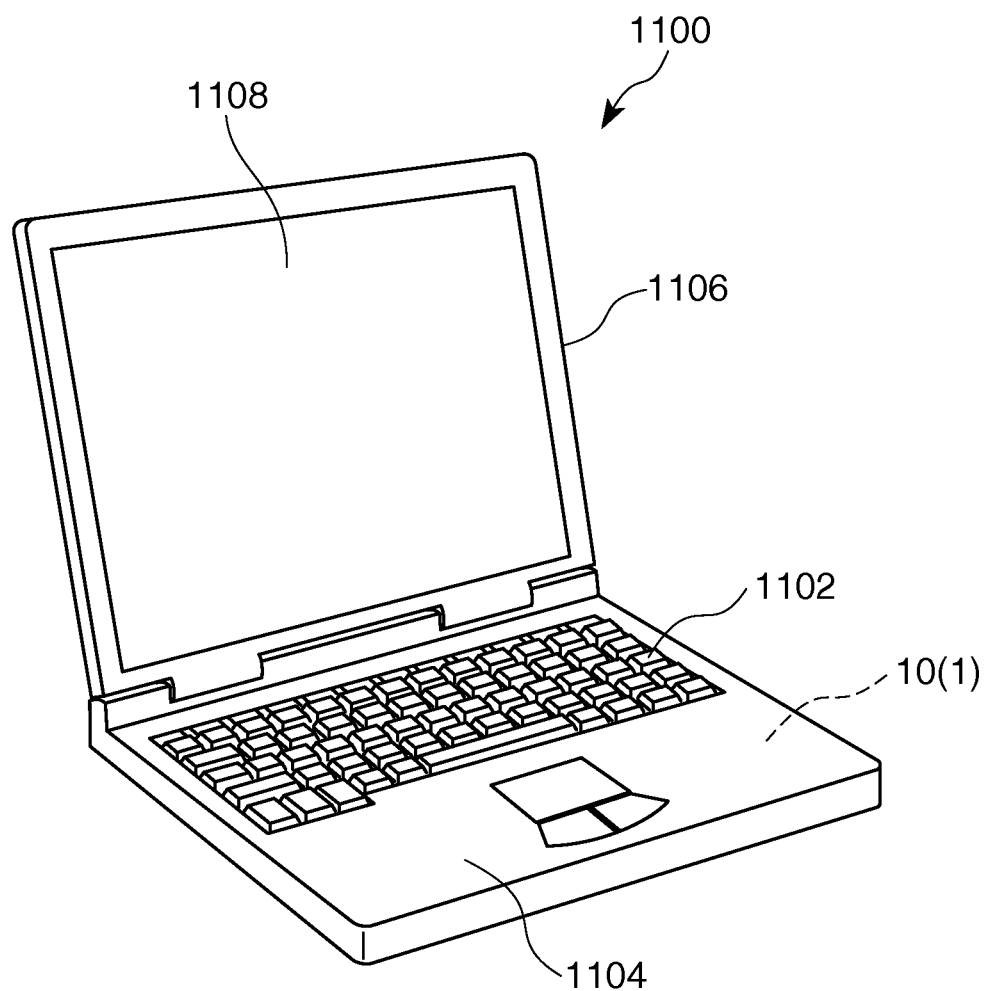
FIG. 11 is a perspective view showing the configuration of a mobile (or notebook) personal computer to which an electronic apparatus of the invention is applied.

FIG. 11 is a perspective view showing the configuration of a mobile (or notebook) personal computer to which the electronic apparatus of the invention is applied. In the drawing, the personal computer 1100 is composed of a main body portion 1104 including a keyboard 1102 and a display unit 1106 including a display portion 1108. The display unit 1106 is rotatably supported relative to the main body portion 1104 via a hinge structure portion. In the personal computer 1100, the resonator 10 (the resonating element 1) that functions as a filter, a resonating device, a reference clock, or the like is incorporated.

Figure 12:
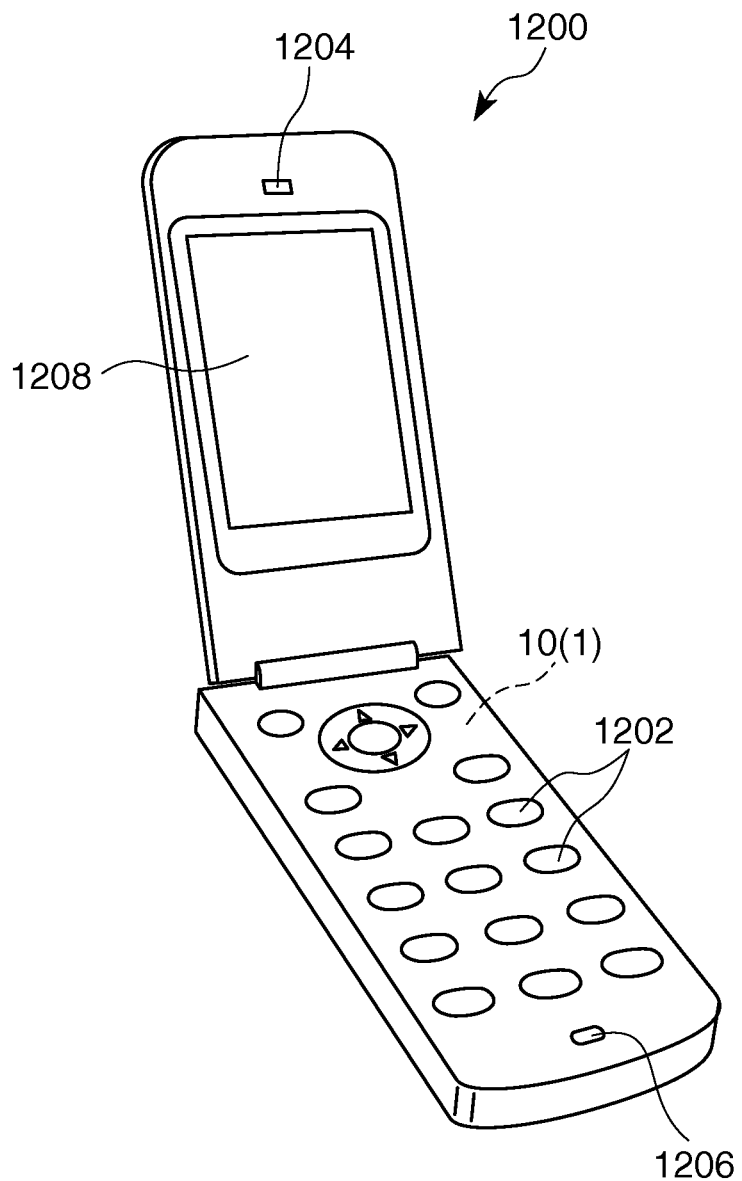
FIG. 12 is a perspective view showing the configuration of a mobile phone (including a PHS) to which the electronic apparatus of the invention is applied.

FIG. 12 is a perspective view showing the configuration of a mobile phone (including a PHS) to which the electronic apparatus of the invention is applied. In the drawing, the mobile phone 1200 includes a plurality of operation buttons 1202, an earpiece 1204, and a mouthpiece 1206. A display portion 1208 is provided between the operation buttons 1202 and the earpiece 1204. In the mobile phone 1200, the resonator 10 (the resonating element 1) that functions as a filter, a resonating device, or the like is incorporated.

Figure 13:
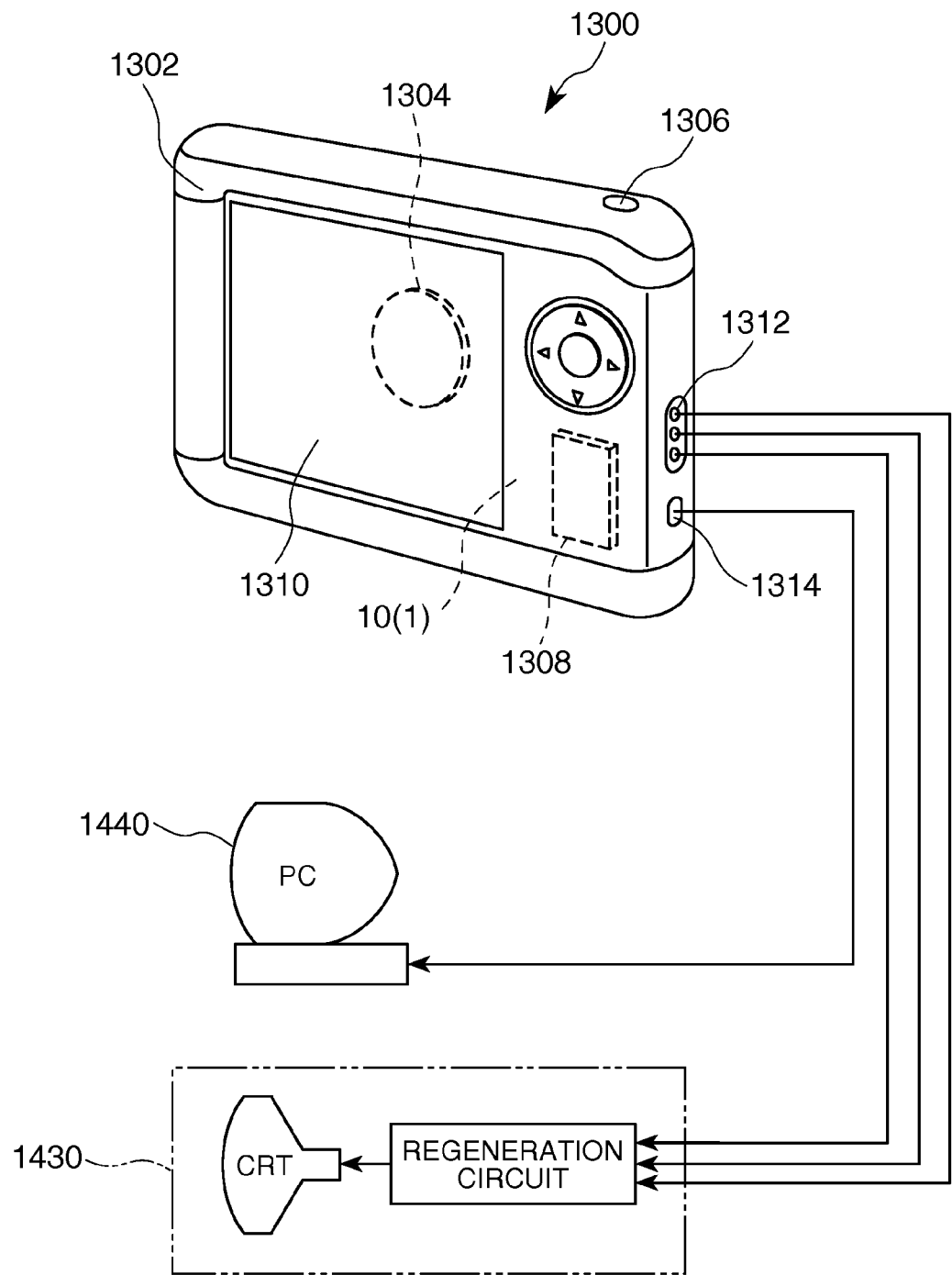
FIG. 13 is a perspective view showing the configuration of a digital still camera to which the electronic apparatus of the invention is applied.

FIG. 13 is a perspective view showing the configuration of a digital still camera to which the electronic apparatus of the invention is applied. In the drawing, also connections with external apparatuses are shown in a simplified manner. Here, usual cameras expose a silver halide photographic film with an optical image of a subject, whereas the digital still camera 1300 photoelectrically converts an optical image of a subject with an imaging element such as a CCD (Charge Coupled Device) to generate imaging signals (image signals).

A display portion 1310 is disposed on a back surface of a case (body) 1302 in the digital still camera 1300 and configured to perform display based on imaging signals generated by a CCD. The display portion 1310 functions as a finder that displays a subject as an electronic image. Moreover, on the front side (the rear side in the drawing) of the case 1302, a light receiving unit 1304 including an optical lens (imaging optical system) and a CCD is disposed.

When a photographer confirms a subject image displayed on the display portion and presses down a shutter button 1306, imaging signals of a CCD at the time are transferred to and stored in a memory 1308. In the digital still camera 1300, a video signal output terminal 1312 and a data communication input/output terminal 1314 are disposed on a side surface of the case 1302. Then, as shown in the drawing, a television monitor 1430 and a personal computer 1440 are connected as necessary to the video signal output terminal 1312 and the data communication input/output terminal 1314, respectively. Further, the imaging signals stored in the memory 1308 are output to the television monitor 1430 or the personal computer 1440 by a predetermined operation. In the digital still camera 1300, the resonator 10 (the resonating element 1) that functions as a filter, a resonating device, or the like is incorporated.

An electronic apparatus including the resonating element of the invention can be applied to for example, in addition to the personal computer (mobile personal computer) of FIG. 11, the mobile phone of FIG. 12, and the digital still camera of FIG. 13, inkjet ejection apparatuses (for example, inkjet printers), laptop personal computers, television sets, video camcorders, video tape recorders, car navigation systems, pagers, electronic notebooks (including those with communication function), electronic dictionaries, calculators, electronic gaming machines, word processors, workstations, videophones, surveillance television monitors, electronic binoculars, POS terminals, medical equipment (for example, electronic thermometers, sphygmomanometers, blood glucose meters, electrocardiogram measuring systems, ultrasonic diagnosis apparatuses, and electronic endoscopes), fishfinders, various types of measuring instrument, indicators (for example, indicators used in vehicles, aircraft, and ships), and flight simulators.

5. Mobile Object

Next, a mobile object (mobile object of the invention) to which the resonator of the invention is applied will be described.

Figure 14:
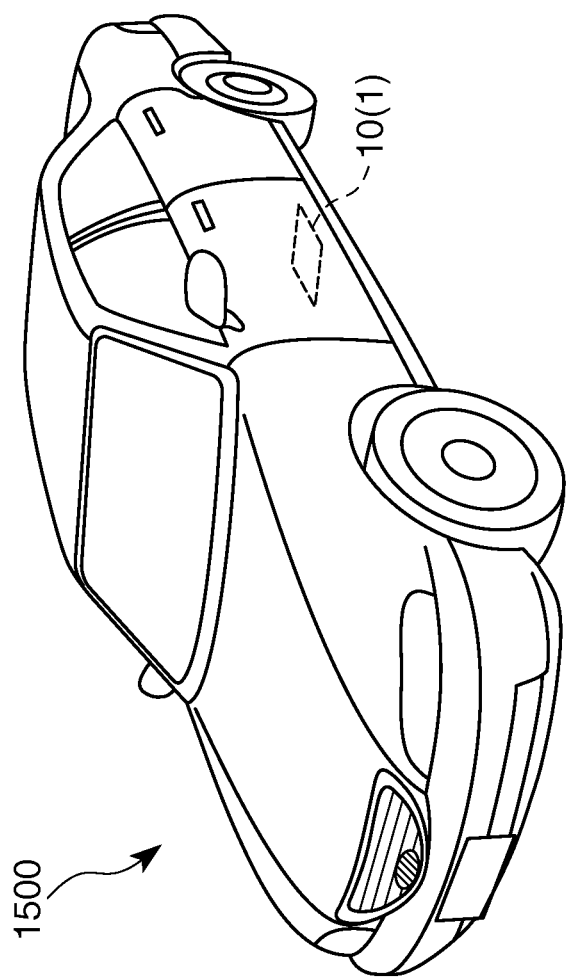
FIG. 14 is a perspective view schematically showing an automobile as an example of a mobile object of the invention.

FIG. 14 is a perspective view schematically showing an automobile as an example of the mobile object of the invention. On the automobile 1500, the resonator 10 (the resonating element 1) is mounted. The resonator 10 can be applied widely to electronic control units (ECUs) such as for keyless entry systems, immobilizers, car navigation systems, car air-conditioners, anti-lock brake systems (ABSs), air bags, tire pressure monitoring systems (TPMSs), engine control, battery monitors of hybrid and electric automobiles, and automobile body attitude control systems.

The resonating element, the resonator, the oscillator, the electronic apparatus, and the mobile object of the invention have been described above based on the embodiments shown in the drawings. However, the invention is not limited to them. The configuration of each of the portions can be replaced with any configuration having a similar function. Moreover, any another component may be added to the invention. Moreover, the embodiments described above may be appropriately combined with one another.

Moreover, in the resonating element of the invention, one of the pair of excitation electrodes may have the shape of the first embodiment described above, while the other may have the shape of the second embodiment described above.

The entire disclosure of Japanese Patent Application No. 2013-154910, filed Jul. 25, 2013 is expressly incorporated by reference herein.

The invention claimed is:

1. A resonating element comprising:
a quartz crystal substrate having a vibrating portion and a thin-walled portion integrated with the vibrating portion, the vibrating portion including a vibration region vibrating in a thickness-shear vibration direction, the thin-walled portion being thinner than the vibrating portion; and
a pair of excitation electrodes respectively disposed on opposite surfaces of the vibrating portion, wherein when directions orthogonal to each other in a plan view of the quartz crystal substrate are a first direction and a second direction, at least one of the pair of excitation electrodes has a constricted portion where each of a pair of sides of the excitation electrode extending in the first direction includes a portion that is convexly curved toward a center line of the excitation electrode in the second direction.

2. The resonating element according to claim 1, wherein when axes obtained by rotating, about an X-axis as an electrical axis of quartz crystal, a Z-axis as an optic axis and a Y-axis as a mechanical axis by a predetermined angle are defined as a Z'-axis and a Y'-axis, the quartz crystal substrate has a thickness in a direction along the Y'-axis and extends in an XZ'-plane direction.

3. The resonating element according to claim 2, wherein the constricted portion extends along an entire length of the excitation electrode in the second direction.

4. The resonating element according to claim 2, wherein the first direction is the Z'-axis direction, and the second direction is the X-axis direction.

5. The resonating element according to claim 4, wherein the pair of sides are each a curved arc.

6. The resonating element according to claim 5, wherein when a diameter of a circle having the arc as a portion of a circumference of the circle is $\phi$, a length of the vibrating portion in the X-axis direction is Mx, a length of the vibrating portion in the Z'-axis direction is Mz, and an order of a vibration mode in the Z'-axis direction is N (where N is a natural number of 2 or more), the relation:

$$\left(\frac{Mx}{Mz/(N+3)}\right) \times 0.8 \leq \varphi \leq \left(\frac{Mx}{Mz/(N+3)}\right) \times 1.2 \quad (1)$$

is satisfied.

7. The resonating element according to claim 4, wherein a region involved in the vibration mode in N=2 in the Z'-axis direction has a first region that is located at the constricted portion and a second region and a third region that are located outside the excitation electrode and arranged along the Z'-axis with the first region interposed therebetween.

8. The resonating element according to claim 2, wherein the first direction is the X-axis direction, and the second direction is the Z'-axis direction.

9. The resonating element according to claim 8, wherein the pair of sides are each a curved arc.

10. The resonating element according to claim 9, wherein when a diameter of a circle having the arc as a portion of a circumference of the circle is $\phi$, a length of the vibrating portion in the X-axis direction is Mx, a length of the vibrating portion in the Z'-axis direction is Mz, and an order of a vibration mode in the X-axis direction is N (where N is a natural number of 3 or more), the relation:

$$\left(\frac{Mz}{Mx/(N+2)}\right) \times 0.8 \leq \varphi \leq \left(\frac{Mz}{Mx/(N+2)}\right) \times 1.2 \quad (2)$$

is satisfied.

11. The resonating element according to claim 8, wherein a region involved in the vibration mode in N=3 in the X-axis direction has a first region that is located at the constricted portion and a second region and a third region that are located outside the excitation electrode and arranged along the X-axis with the first region interposed therebetween.

12. A resonator comprising:
the resonating element according to claim 1; and
a package accommodating the resonating element.

13. An oscillator comprising:
the resonating element according to claim 1; and
an oscillator circuit driving the resonating element.

14. An electronic apparatus comprising the resonating element according to claim 1.

15. A mobile object comprising the resonating element according to claim 1.

* * * * *